US011231573B2

(12) United States Patent
Fujishima et al.

(10) Patent No.: US 11,231,573 B2
(45) Date of Patent: Jan. 25, 2022

(54) POSITION DETECTION APPARATUS, EXPOSURE APPARATUS, AND ARTICLE MANUFACTURING METHOD

(71) Applicant: CANON KABUSHIKI KAISHA, Tokyo (JP)

(72) Inventors: Hironobu Fujishima, Saitama (JP); Hironori Maeda, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/826,458

(22) Filed: Mar. 23, 2020

(65) Prior Publication Data

US 2020/0319447 A1 Oct. 8, 2020

(30) Foreign Application Priority Data

Apr. 2, 2019 (JP) .............................. JP2019-070712

(51) Int. Cl.
*G03F 9/00* (2006.01)
*G02B 21/10* (2006.01)
*G01B 11/26* (2006.01)

(52) U.S. Cl.
CPC .............. *G02B 21/10* (2013.01); *G01B 11/26* (2013.01); *G03F 9/7088* (2013.01)

(58) Field of Classification Search
CPC .. G02B 21/10; G02B 21/0016; G02B 21/361; G01B 11/26; G03F 9/7088; G03F 7/70775; G03F 9/7069; G01M 11/02; G01M 11/04
USPC ............................ 356/620–624, 237.2–237.6
See application file for complete search history.

(56) References Cited

U.S. PATENT DOCUMENTS

| | | | | |
|---|---|---|---|---|
| 2007/0058164 | A1* | 3/2007 | Shibata | G01N 21/95607 356/237.2 |
| 2009/0015813 | A1* | 1/2009 | Maeda | G03F 9/7049 355/68 |
| 2013/0114880 | A1* | 5/2013 | Matsumoto | G01B 11/303 382/149 |
| 2013/0221556 | A1* | 8/2013 | Miyaharu | G01D 5/266 264/40.1 |
| 2019/0371642 | A1* | 12/2019 | Iwai | H01L 21/681 |

FOREIGN PATENT DOCUMENTS

JP 3994209 B2 10/2007

* cited by examiner

*Primary Examiner* — Isiaka O Akanbi
(74) *Attorney, Agent, or Firm* — Rossi, Kimms & McDowell LLP

(57) ABSTRACT

Position detection apparatus includes illumination optical system for illuminating target, detection optical system for forming image of the illuminated target illuminated on photoelectric converter, first array having first aperture stops, second array having second aperture stops, first driving mechanism for arranging the selected first aperture stop on pupil of the illumination optical system by driving the first array such that first aperture stop crossing optical axis of the illumination optical system moves in first direction, second driving mechanism for arranging the selected second aperture stop on pupil of the detection optical system by driving the second array such that second aperture stop crossing optical axis of the detection optical system moves in second direction. The first and second driving mechanisms fine-tune positions of the selected first and second aperture stops in the first and second directions, respectively.

12 Claims, 8 Drawing Sheets

EXP

|  | FIRST APERTURE STOP | SECOND APERTURE STOP |
| --- | --- | --- |
| Ex | a | b |
| Ey | c | d |

POSITION DETECTION APPARATUS, EXPOSURE APPARATUS, AND ARTICLE MANUFACTURING METHOD

BACKGROUND OF THE INVENTION

Field of the Invention

The present invention relates to a position detection apparatus, an exposure apparatus, and an article manufacturing method.

Description of the Related Art

Exposure apparatuses are required to improve overlay accuracy as well as the reduction of a resolvable line width. In general, such an apparatus is required to achieve overlay accuracy corresponding to about ⅕ the resolvable line width in terms of numerical values. That is, it is necessary to further improve the overlay accuracy in accordance with a prospective reduction of the resolvable line width. In order to improve the overlay accuracy, it is necessary to accurately tune a position detection apparatus incorporated in an exposure apparatus. The position detection apparatus can include an illumination optical system that illuminates marks provided on a substrate and a detection optical system that forms a mark image on an image capturing plane from light from a mark and detects the image. Improving a mark image formed on an image capturing plane by tuning the aperture stops that can be provided in an illumination optical system and a detection optical system is important to achieve high accuracy.

Japanese Patent No. 3994209 discloses a technique for tuning the illumination telecentricity of an illumination optical system by turning the position of an illumination aperture stop and a technique for tuning the vignetting of a light beam in a detection optical system by tuning the position of an aperture stop.

When the pupil of a position detection apparatus is to be tuned by driving the aperture stop, the arrangement of a driving mechanism that drives the aperture stop is preferably minimized. Consider, for example, a position detection apparatus including an aperture stop driving mechanism having two tuning axes in the X and Y directions in both an illumination optical system and a detection optical system. The driving mechanism of the apparatus becomes complicated. Such a position detection apparatus is disadvantageous in terms of cost. In addition, the complicated arrangement can affect tuning accuracy.

On the other hand, the quality of an image of a target is an important factor that influences the position decision accuracy of a position detection system. This quality can greatly change depending on the process of processing a substrate. The position detection optical system incorporated in an exposure apparatus can be required to have image quality compatible with various processes. As techniques available for such a purpose, for example, a bright-field illumination method and a dark-field illumination method are known, and the angles of illumination light and captured light can be selected by changing the aperture stop shape of the position detection optical system. Accordingly, the tuning scheme based on aperture stop driving is also required to be highly compatible with this switching mechanism.

SUMMARY OF THE INVENTION

The present invention provides a technique highly compatible with an aperture stop switching mechanism and advantageous in being capable of tuning the position of the pupil with a simple arrangement.

One of aspects of the present invention provides a position detection apparatus comprising: a photoelectric converter: an illumination optical system configured to illuminate a target; a detection optical system configured to form an image of the target illuminated with light from the illumination optical system on a light-receiving surface of the photoelectric converter; a first array having a plurality of first aperture stops that can be arranged on a pupil of the illumination optical system; a second array having a plurality of second aperture stops that can be arranged on a pupil of the detection optical system; a first driving mechanism configured to arrange a first aperture stop selected from the plurality of first aperture stops on the pupil of the illumination optical system by driving the first array such that a first aperture stop, of the plurality of first aperture stops, which crosses an optical axis of the illumination optical system, moves in a first direction; and a second driving mechanism configured to arrange a second aperture stop selected from the plurality of second aperture stops on the pupil of the detection optical system by driving the second array such that a second aperture stop, of the plurality of second aperture stops, which crosses an optical axis of the detection optical system, moves in a second direction intersecting with the first direction, wherein the first driving mechanism can fine-tune a position of the selected first aperture stop in the first direction, and the second driving mechanism can fine-tune the selected second aperture stop in the second direction.

Further features of the present invention will become apparent from the following description of exemplary embodiments with reference to the attached drawings.

DESCRIPTION OF THE EMBODIMENTS

Figure 1:
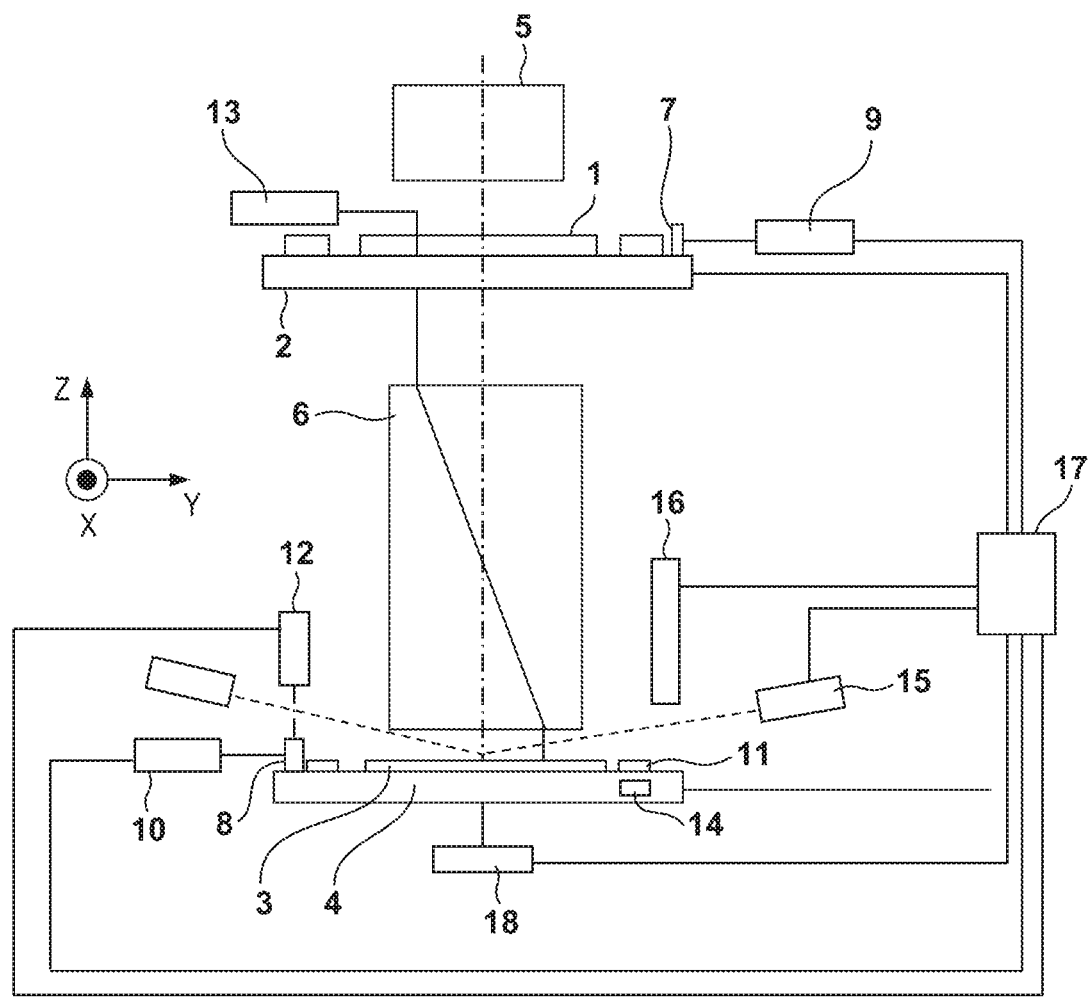
FIG. 1 is a view showing an example of the arrangement of an exposure apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Figure 2:
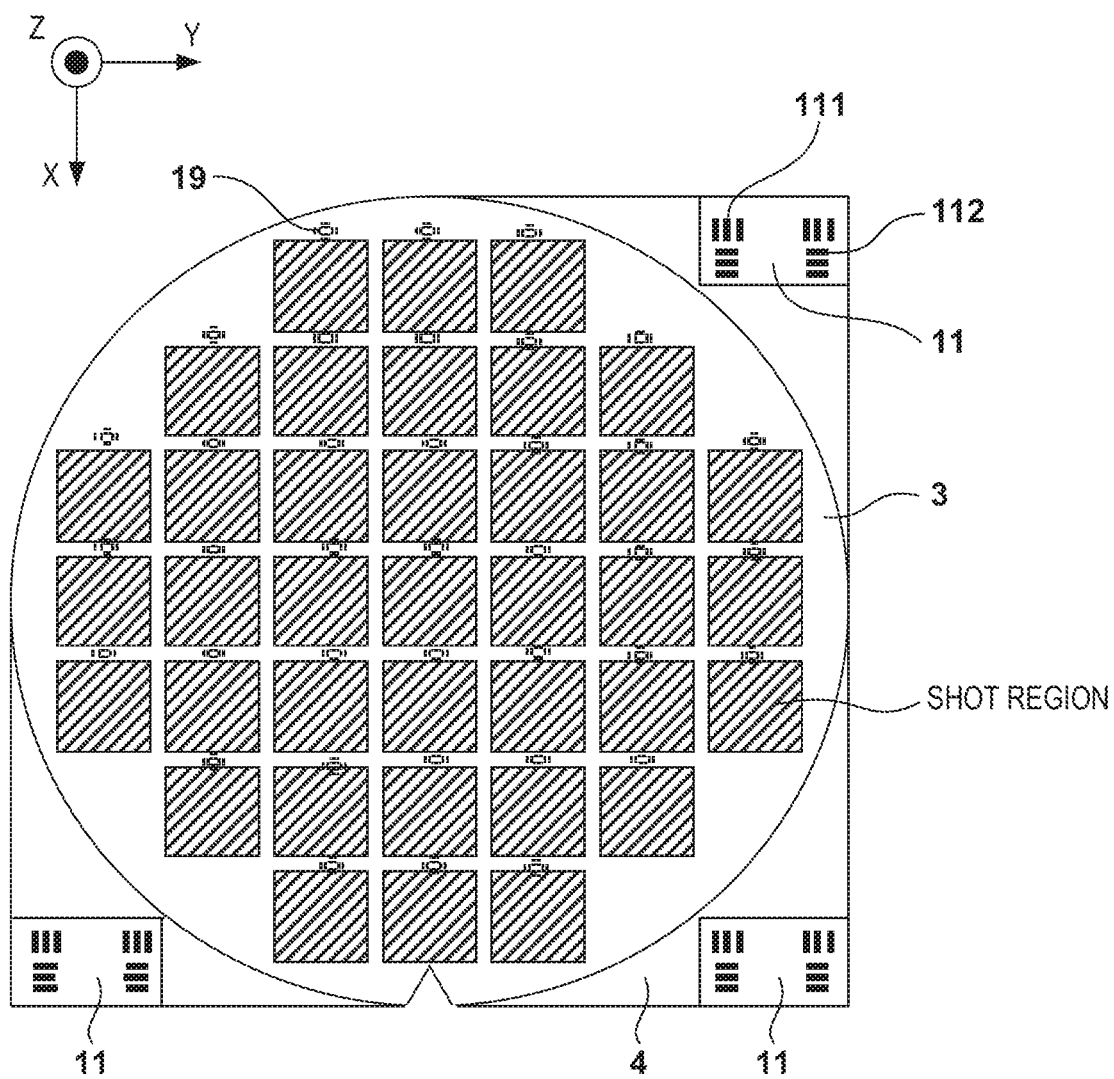
FIG. 2 is a view showing an example of the arrangement of a substrate stage of the exposure apparatus in FIG. 1.
Figure 3:
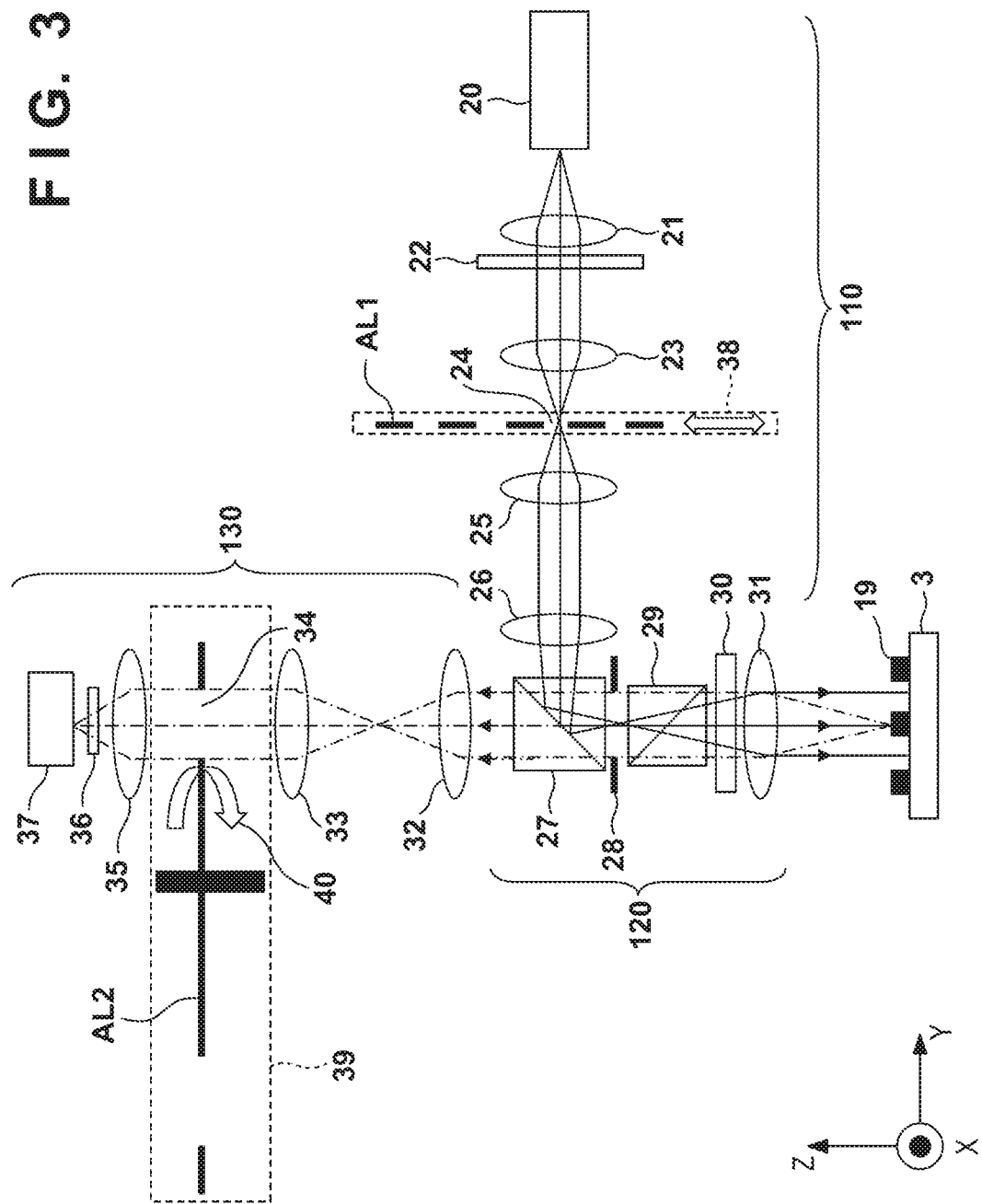
FIG. 3 is a view showing an example of the arrangement of a position detection system (position detection apparatus) incorporated in the exposure apparatus in FIG. 1.

FIG. 1 shows an example of the arrangement of an exposure apparatus EXP according to the first embodiment. FIG. 2 shows an example of the arrangement of a substrate stage 4 of the exposure apparatus EXP in FIG. 1. FIG. 3 shows an example of the arrangement of a position detection system (position detection apparatus) 16 incorporated in the exposure apparatus EXP in FIG. 1. The exposure apparatus EXP can include an original stage 2 that holds an original 1, the substrate stage 4 that holds the substrate 3, and an illumination system 5 that illuminates the original 1 held by the original stage 2 with exposure light. The exposure apparatus EXP can also include a projection optical system 6 that projects a pattern of the original 1 illuminated with exposure light onto a substrate 3 held by the substrate stage 4 and forms an image of the pattern on the substrate 3 and a control unit 17 that controls the components of the exposure apparatus EXP. In addition, the exposure apparatus EXP can include a substrate driving mechanism 18 that drives the substrate 3 by driving the substrate stage 4 and an original driving mechanism (not shown) that drives the original 1 by driving the original stage 2.

The exposure apparatus EXP can be configured as a scanning exposure apparatus (scanning stepper) that transfers the pattern of the original 1 onto the substrate 3 by synchronously driving the original 1 and the substrate 3 in the scanning direction. Alternatively, the exposure apparatus EXP may be configured as an exposure apparatus (stepper) that transfers the pattern of the original 1 onto the substrate 3 while the original 1 and the substrate 3 remain at rest. In the following description, in the XYZ coordinate system, a direction coinciding with the optical axis of the projection optical system 6 is defined as the Z-axis direction, and directions parallel to a plane perpendicular to the Z-axis direction are respectively defined as the X-axis direction and the Y-axis direction. In addition, any directions parallel to the X-axis defining the XYZ coordinate system are called the X-axis directions, any directions parallel to the Y-axis defining the XYZ coordinate system are called the Y-axis directions, and any directions parallel to the Z-axis defining the XYZ coordinate system are called the Z-axis directions. Furthermore, the directions of rotation about the X-axis, the Y-axis, and the Z-axis are respectively called the θX, θY, and θZ directions.

The illumination system 5 illuminates a predetermined illumination region of the original 1 with exposure light having a uniform illuminance distribution. The illumination system 5 can have a light source such as a mercury lamp, KrF excimer laser, ArF excimer laser, F2 laser, or EUV (Extreme Ultra Violet) light source. The original stage 2 can be configured to be capable of two-dimensional movement along a plane (X-Y plane) perpendicular to the optical axis of the projection optical system 6 and fine rotation in the θZ direction while holding the original 1. The original driving mechanism that drives the original stage 2 can include a motor such as a linear motor. The control unit 17 controls the original driving mechanism. The original stage 2 is provided with an original stage mirror 7. In addition, a laser interferometer 9 that measures the position and posture of the original stage 2 is provided at a position facing the original stage mirror 7. The laser interferometer 9 measures in real time the X-axis direction position, Y-axis direction position, and θZ direction rotational angle of the original stage 2, and provides the measurement results to the control unit 17. The control unit 17 can position the original 1 held by the original stage 2 by controlling the original driving mechanism based on the measurement results from the laser interferometer 9.

The projection optical system 6 projects the pattern of the original 1 onto the substrate 3 at a projection magnification β. The projection optical system 6 can be constituted by a plurality of optical elements. The projection optical system 6 can be configured as a reduction projection optical system with the projection magnification β of ¼ or ⅕. The substrate stage 4 holds the substrate 3. The substrate stage 4 can include, for example, a Z stage equipped with a substrate chuck that holds the substrate 3 and an XY stage that supports the Z stage. The substrate driving mechanism 18 can include a motor such as a linear motor. The control unit 17 controls the substrate driving mechanism 18. The substrate stage 4 is provided with a substrate stage mirror 8. The substrate stage mirror 8 can be provided with laser interferometers 10 and 12 that measure the position and posture of the substrate stage 4 at a position facing the substrate stage mirror 8. The laser interferometer 10 can measure in real time the X-axis direction position, Y-axis direction position, and θZ direction rotational angle of the substrate stage 4, and provide the measurement results to the control unit 17. In addition, the laser interferometer 12 can measure in real time the Z-axis direction position of the substrate stage 4 and rotational angles in the θX and θY directions and provide the measurement results to the control unit 17. The substrate 3 held by the substrate stage 4 can be positioned by controlling the substrate driving mechanism 18 based on the measurement results from the laser interferometers 10 and 12.

A stage reference plate or plates 11 is or are installed on one or a plurality of corners of the substrate stage 4 at almost the same height as the surface of the substrate 3. The stage reference plate 11 is provided with a reference mark 111 whose position is detected by original position detection systems 13 and 14 and a reference mark 112 whose position is detected by the position detection system 16. The relative position between the reference mark 111 and the reference mark 112 is known. The reference mark 111 and the reference mark 112 may be common marks.

The original position detection system 13 can be provided near the original stage 2. The original position detection system 13 can detect the relative position between a mark provided on the original 1 and the reference mark 111 by using light from the illumination system 5 which is used to expose the substrate 3 to light. The reference mark 111 detected by the original position detection system 13 can a reflective mark. The reference mark 111 may be a transmissive mark. In this case, the original position detection system 14 can detect the reference mark 111. The original position detection system 14 can include a light amount sensor for detecting transmitted light from the transmissive reference mark 111. It is possible to detect transmitted light from the reference mark 111 by using the original position detection system 14 while driving the substrate stage in the X-axis direction, Y-axis direction, and Z-axis direction. This makes it possible to detect the relative positions between a mark and the reference mark 111 on the original 1 in the X-axis direction, Y-axis direction, and Z-axis direction.

A focus detection system 15 includes a projection optical system that obliquely projects detection light on the surface of the substrate 3 and a light-receiving system that receives reflected light from the substrate 3. The detection result obtained by the focus detection system 15 can be provided to the control unit 17. The control unit 17 can tune the Z-axis direction position (focus position) and inclination angle of the substrate 3 held on the Z stage by driving the Z stage based on the detection result obtained by the focus detection system 15.

The position detection system 16 can include a projection system that projects detection light onto a mark (an alignment mark 19 or the reference mark 112 on the stage reference plate 11 in this case) as an example of a target on the substrate 3 and a light-receiving system that receives reflected light from the mark. The position detection system 16 is connected to the control unit 17. The detection result obtained by the position detection system 16 is provided to the control unit 17. The control unit 17 can position the substrate 3 held on the substrate stage 4 in the X-axis direction, Y-axis direction, and OZ direction by driving the substrate stage 4 in the X-axis direction, Y-axis direction, and OZ direction based on the detection result obtained by the position detection system 16.

The control unit 17 can be implemented by a PLD (Programmable Logic Device) such as an FPGA (Field Programmable Gate Array) or an ASIC (Application Specific Integrated Circuit). Alternatively, the control unit 17 can be implemented by a general-purpose or dedicated computer incorporating programs or a combination of all or some of the above components.

The position detection system 16 will be described below with reference to FIG. 3. In this case, two schemes are available as the forms of optical position detection systems that observe alignment marks on a substrate. The first scheme is to observe a mark without being through the projection optical system 6. This scheme is called the Off-axis scheme. The second scheme is to detect a mark through the projection optical system 6. This scheme is called the TTL (Through the Lens) scheme. The following will exemplify the position detection system 16 based on the Off-axis scheme. However, the position detection system 16 may be configured as a system based on the TTL scheme.

The position detection system 16 can include, for example, a light source 20, an illumination optical system 110, a common optical system 120, and a detection optical system 130. The light source 20 can generate, for example, visible light (for example, in a wavelength region of 550 nm to 700 nm), blue light (for example, in a wavelength region of 450 nm to 550 nm), and infrared light (for example, in a wavelength region of 700 nm to 1,500 nm).

The illumination optical system 110 can include, for example, a first illumination optical element 21, a wavelength filter plate 22, a second illumination optical element 23, a plurality of first aperture stops 24, a first driving mechanism 38, a third illumination optical element 25, and a fourth illumination optical element 26. The common optical system 120 is an optical system shared by the illumination optical system 110 and the detection optical system 130. The common optical system 120 can include, for example, a polarizing beam splitter 27, a variable NA aperture stop 28, a prism 29, a λ/4 plate 30, and an objective lens 31. The detection optical system 130 can include a relay lens 32, a first detection optical element 33, a plurality of second stops (second aperture stops) 34, a second driving mechanism 39, a second detection optical element 35, an optical member 36, and a photoelectric converter 37.

The illumination light generated by the light source 20 can enter the first illumination optical element 21 directly or through a light guide component such as an optical fiber and be transmitted through the wavelength filter plate 22 and the second illumination optical element 23. As the wavelength filter plate 22, an array having a plurality of wavelength filter plates 22 may be used, and one of a plurality of wavelength filters may be selected and arranged on the optical path in accordance with a command from the control unit 17. The plurality of wavelength filters can include, for example, a wavelength filter that transmits blue light, a wavelength filter that transmits visible light, and a wavelength filter that transmits infrared light. This arrangement makes it possible to select the wavelength of light to be used by the position detection system 16. One of the first aperture stops 24 arranged on a first array AL1 can be selectively arranged on the pupil plane (an optical Fourier transform plane with respect to an object surface) of the illumination optical system 110.

The illumination light passing through the first aperture stop 24 arranged on the pupil plane of the illumination optical system 110 enters the polarizing beam splitter 27 through the third illumination optical element 25 and the fourth illumination optical element 26. In this case, the polarizing beam splitter 27 reflects S-polarized light perpendicular to the drawing surface. The S-polarized light as illumination light reflected by the polarizing beam splitter 27 passes through the variable NA aperture stop 28, which operates in accordance with an instruction from the control unit 17, and the prism 29. The prism 29 can be used to branch an optical path to an optical system (not shown). The illumination light passing through the prism 29 is then transmitted through the λ/4 plate 30 to be converted into circularly polarized light, passes through the objective lens 31, and illuminates the alignment mark 19 provided on the substrate 3.

The diffracted light (indicated by the chain lines in FIG. 3) generated from the alignment mark 19 passes through the objective lens 31 and the λ/4 plate 30 again to be converted into P-polarized light parallel to the drawing surface. The P-polarized light is transmitted through the prism 29 and the polarizing beam splitter 27. The diffracted light transmitted through the polarizing beam splitter 27 is transmitted through the relay lens 32 and the first detection optical element 33 and enters the pupil plane of the detection optical system 130. One of the plurality of second aperture stops 34 arranged on a second array AL2 can be arranged on the pupil plane of the detection optical system 130.

The diffracted light passing through the second aperture stop 34 arranged on the pupil plane of the detection optical system 130 enters the light-receiving surface (image capturing plane) of the photoelectric converter (image capturing device) 37 through the second detection optical element 35 and the optical member 36. The optical member 36 can be used to tune a wavelength shift difference. The photoelectric converter 37 can include, for example, a CCD image sensor. The photoelectric converter 37 can tune the time, during which photoelectrically converted charge is accumulated, in accordance with the intensity of light generated from the alignment mark 19 in response to a command from the control unit 17. The exposure apparatus EXP can align the substrate 3 with the original 1 by deciding the driving amount of the substrate 3 by the substrate driving mechanism 18 using the information of the alignment mark 19 which is obtained by the position detection system 16.

Figure 4:
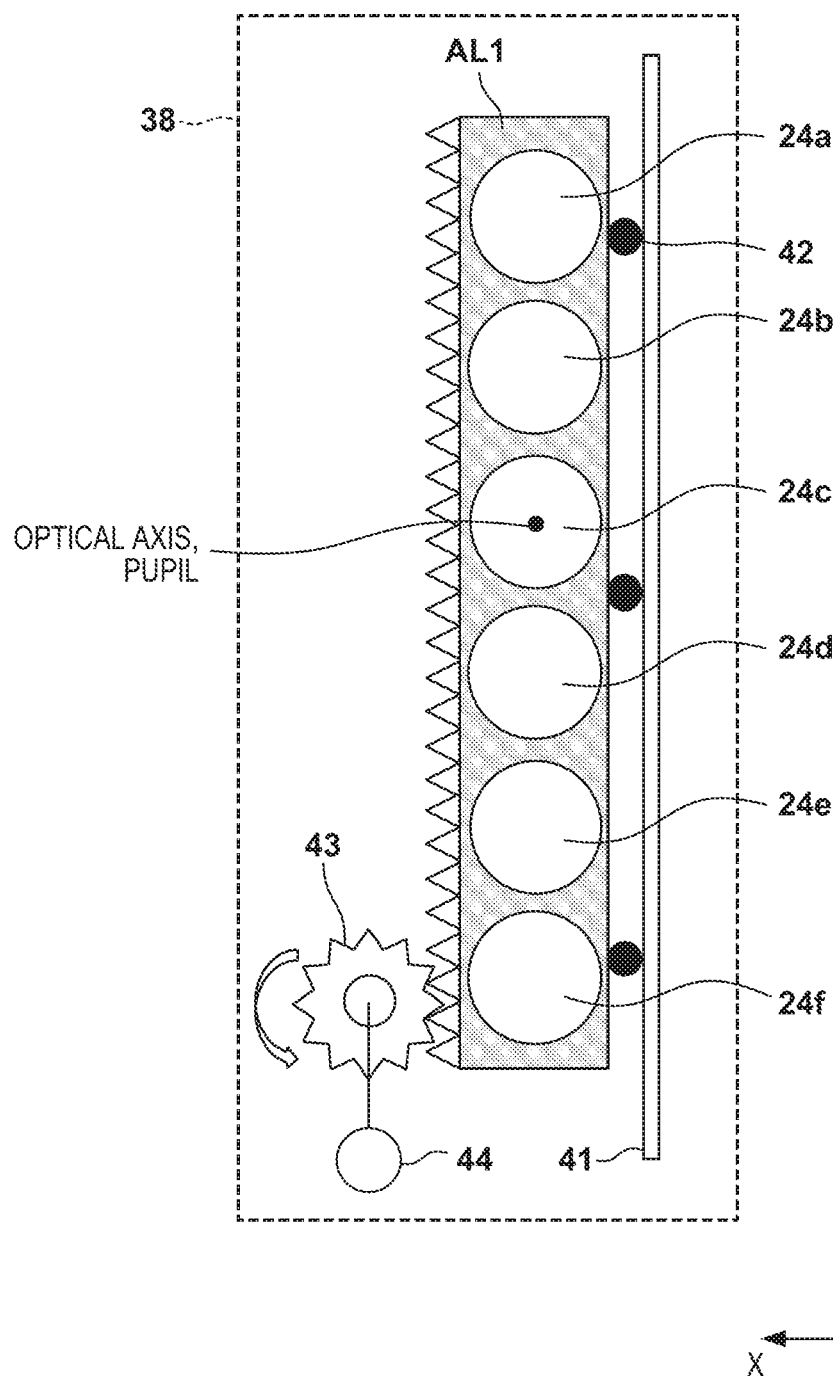
FIG. 4 is a view exemplarily showing a mechanism for switching a first aperture stop to be arranged on the pupil of an illumination optical system and fine-tuning the first aperture stop.

An arrangement for arranging, on the pupil plane of the illumination optical system 110, one first aperture stop 24 selected from the plurality of first aperture stops 24 (24a to 240 by the control unit 17 will be exemplified with reference to FIG. 4. The position detection system 16 can include the first array AL1 having the plurality of first aperture stops 24 that can be arranged on the pupil of the illumination optical system 110 and the first driving mechanism 38 that arranges the first aperture stop 24 selected from the plurality of first aperture stops 24 on the pupil of the illumination optical system 110. The first driving mechanism 38 can drive the first array AL1 such that a first aperture stop 24, of the plurality of first aperture stops 24, which crosses the optical axis (parallel to the Y-axis direction) of the illumination optical system 110, moves in the first direction (Z-axis direction). This allows the first driving mechanism 38 to arrange the first aperture stop 24 selected from the plurality of first aperture stops 24 on the pupil of the illumination optical system 110.

According to the arrangement example shown in FIG. 4, the plurality of first aperture stops 24 are arranged side by side on the first array (light blocking plate) AL1 along the first direction (Z-axis direction). The first driving mechanism 38 can include a drive gear 43 that drive the first array AL1 in the first direction (Z-axis direction), a drive source 44 that drives the drive gear 43, and a guide rail (guide member) 41 that guides the first array AL1 through a bearing 42. As the drive source 44 rotates/drives the drive gear 43 to drive the first array AL1 in the first direction, the first aperture stop 24 of the plurality of first aperture stops 24 which is selected by the control unit 17 can be arranged on the pupil of the illumination optical system 110. Such an arrangement can be called a guide rail scheme. According to the arrangement example shown in FIG. 4, the plurality of first aperture stops 24 have different shapes. In this case, the different shapes can include different dimensions and shapes that are not similar to each other.

The first driving mechanism 38 can be configured to be capable of fine-tuning the plurality of first aperture stops 24 (first array AL1) in the first direction. In other words, the first driving mechanism 38 can be configured to be capable of fine-tuning the position of the first aperture stop 24 of the plurality of first aperture stops 24 which is selected by the control unit 17 in the first direction. The first array AL1 and the first driving mechanism 38 can constitute a selecting mechanism that selects one first aperture stop 24 to be used for position detection from the plurality of first aperture stops 24 and constitute a fine-tuning mechanism that fine-tunes the position of the selected first aperture stop 24 in the first direction.

The arrangement shown in FIG. 4 is merely an example, and the first driving mechanism 38 can have various arrangements. For example, the first driving mechanism 38 may include a linear motor. The linear motor can be a linear motor with an encoder. The first array AL1 may have an arrangement in which the plurality of first aperture stops 24 are arranged on a circumference. In this case, the first driving mechanism 38 can arrange the first aperture stop 24 of the plurality of first aperture stops 24 which is selected by the control unit 17 on the pupil of the illumination optical system 110 by rotating/driving the first array AL1. The first driving mechanism 38 can also fine-tune the position of the selected first aperture stop 24 in the first direction (the direction of tangent to the circumference on the pupil).

Figure 5:
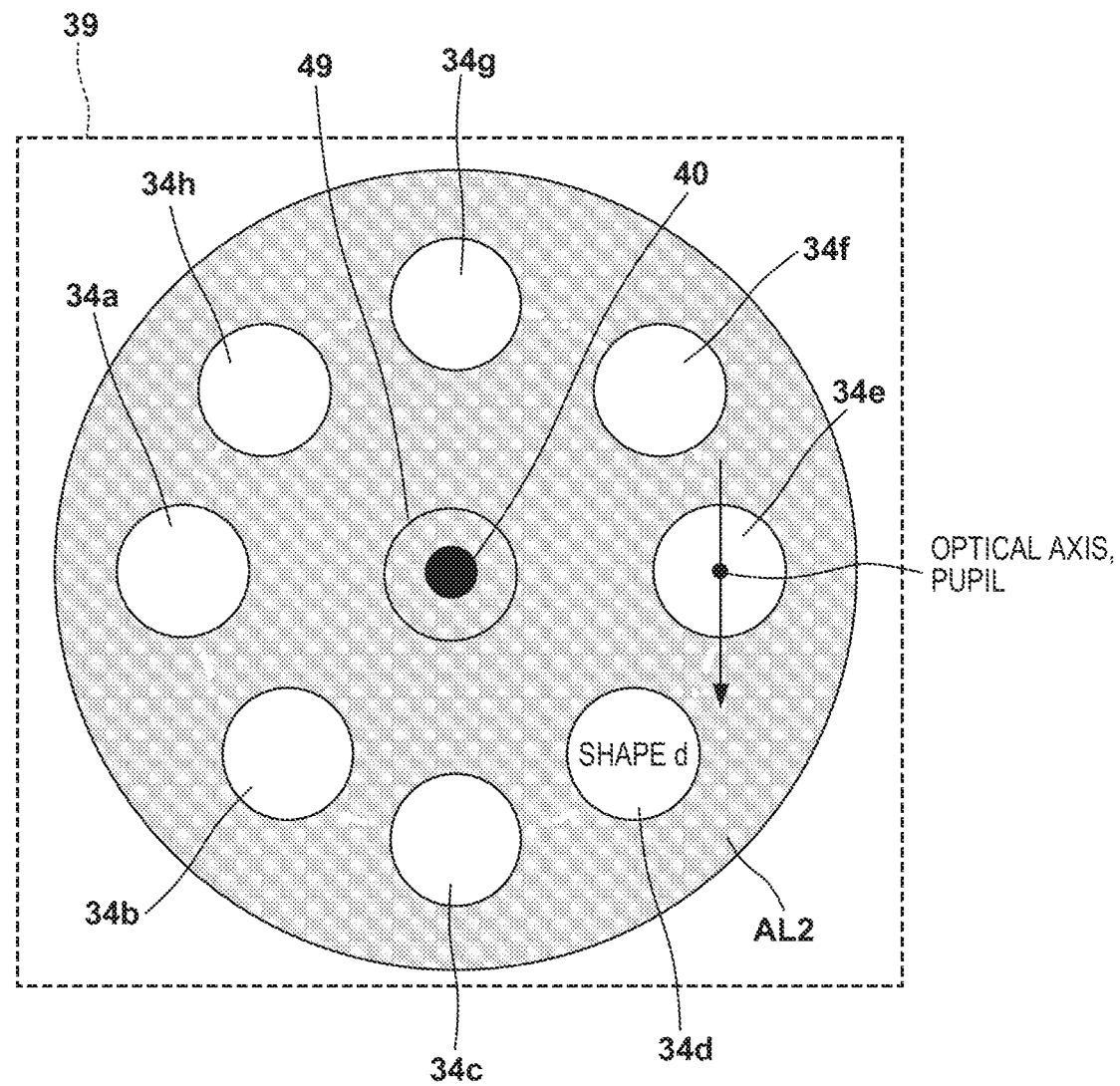
FIG. 5 is a view exemplarily showing a mechanism for switching a second aperture stop to be arranged on the pupil of a detection optical system and fine-tuning the second aperture stop.
Figure 5:
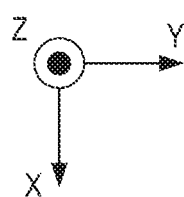

An arrangement for arranging, on the pupil plane of the detection optical system 130, one second aperture stop 34 selected from the plurality of second aperture stops 34 (34a to 34h) by the control unit 17 will be exemplified with reference to FIG. 5. The position detection system 16 can include the second array AL2 having the plurality of second aperture stops 34 that can be arranged on the pupil of the detection optical system 130 and the second driving mechanism 39 that arranges the second aperture stop 34 selected from the plurality of second aperture stops 34 on the pupil of the detection optical system 130. The plurality of second aperture stops 34 have different shapes. In this case, the different shapes can include different dimensions and shapes that are not similar to each other.

The second driving mechanism 39 can drive the second array AL2 such that a second aperture stop 34, of the plurality of second aperture stops 34, which crosses the optical axis (parallel to the Z-axis direction) of the detection optical system 130, moves in the second direction (X-axis direction). This allows the second driving mechanism 39 to arrange the second aperture stop 34 selected from the plurality of second aperture stops 34 on the pupil of the detection optical system 130. The second direction (X-axis direction) is a direction intersecting with (for example, orthogonal to) the first direction (Y-axis direction). The first direction (Y-axis direction) can be a direction parallel to a given plane. The second direction (X-axis direction) can be a direction intersecting with (for example, orthogonal to) the plane. When the first driving mechanism 38 drives the first aperture stop 24 in the first direction (Z-axis direction) in the illumination optical system 110, a light beam from the alignment mark 19 as a target can move on the pupil of the detection optical system 130 in the third direction (Y direction) intersecting with the second direction (X-axis direction).

In the state shown in FIG. 5, a second aperture stop 34e is arranged on the pupil of the detection optical system 130. The second driving mechanism 39 can drive the second array AL2 such that a second aperture stop 34e, of a plurality of second aperture stops 34a to 34h, which crosses the optical axis (parallel to the Z-axis direction) of the detection optical system 130, moves in the second direction (X-axis direction). The second driving mechanism 39 can be configured to be capable of fine-tuning the second aperture stop 34 of the plurality of second aperture stops 34 which is selected by the control unit 17 in the second direction (X-axis direction). The second array AL2 and the second driving mechanism 39 can constitute a selecting mechanism that selects one second aperture stop 34 to be used for position detection from the plurality of second aperture stops 34 and constitute a fine-tuning mechanism that fine-tunes the position of the selected second aperture stop 34 in the second direction.

According to the arrangement example shown in FIG. 5, the plurality of second aperture stops 34 are arranged on the second array (light blocking plate) AL2 so as to be arranged on a circumference centered on the rotation center of a rotating shaft 40. The second driving mechanism 39 can include a second drive source 49 that rotates/drives the rotating shaft 40 fixed to the second array AL2. The second drive source 49 can arrange the second aperture stop 34 of the plurality of second aperture stops 34 which is selected by the control unit 17 on the pupil of the detection optical system 130 by rotating/driving the rotating shaft 40. Such an arrangement can be called a turret scheme. The second driving mechanism 39 can be configured to be capable of fine-tuning the second aperture stop 34 of the plurality of second aperture stops 34 which is selected by the control unit 17 in the second direction (the direction of tangent to the circumference) by rotating the second array AL2 through a fine angle. The second drive source 49 can include, for example, a pulse motor with an encoder.

The arrangement shown in FIG. 5 is merely an example. The plurality of second aperture stops 34 can be arranged side by side on the second array AL2 in the second direction. In this case, the second driving mechanism 39 can arrange the second aperture stop 34 selected from the plurality of second aperture stops 34 on the pupil of the detection optical system 130 by driving the second array AL2 in the second direction and fine-tune the selected second aperture stop 34 in the second direction.

In the example shown in FIGS. 4 and 5, the first driving mechanism 38 drives the entire first array AL1 in the first direction (Y-axis direction), and the second driving mechanism 39 rotates/drives the second array AL2. Instead of such an arrangement, this apparatus may use an arrangement in which the first driving mechanism 38 rotates/drives the first array AL1, and the second driving mechanism 39 rotates/drives the second array AL2. Alternatively, the apparatus may use an arrangement in which the first driving mechanism 38 rotates/drives the first array AL1, and the second driving mechanism 39 drives the entire second array AL2 in the second direction.

The number of first aperture stops 24 arranged on the first array AL1 may be equal to or different from the number of second aperture stops 34 arranged on the second array AL2. All or some of the plurality of first aperture stops 24 may be first aperture stops each having a circular or non-circular shape. All or some of the plurality of first aperture stops 24 may or may not have a light transmittance of 100%. Likewise, all or some of the plurality of second aperture stops 34 may be second aperture stops having a circular or non-circular shape. All or some of the plurality of second aperture stops 34 may or may not have a light transmittance of 100%.

Figure 6:
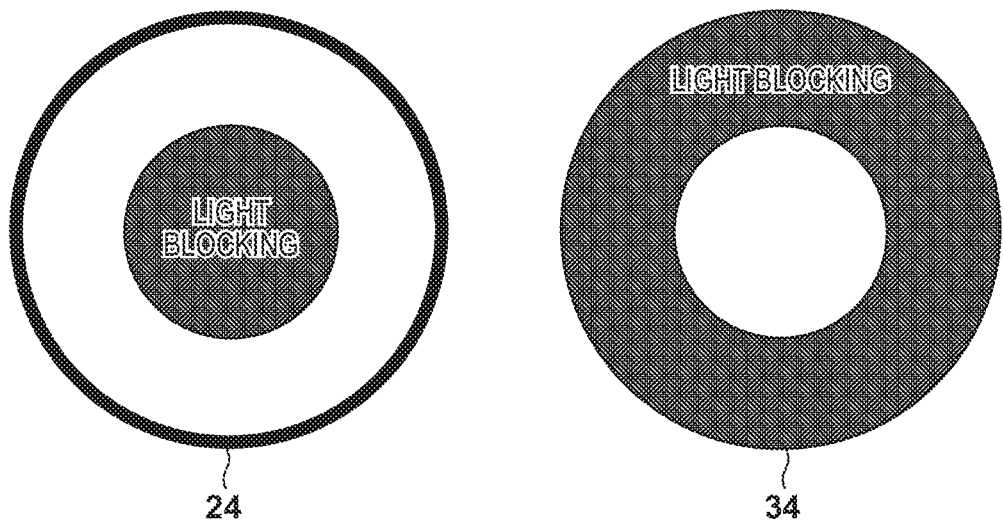
FIG. 6 is a view exemplarily showing a combination of first and second aperture stops for implementing dark-field illumination.

Using the arrangement exemplarily shown in FIGS. 4 and 5 can implement dark-field illumination or modified illumination advantageous in improving the contrast of images detected by the photoelectric converter 37. For example, in order to implement dark-field illumination, as exemplarily shown in FIG. 6, combinations of first aperture stops 24 and second aperture stops 34 with inverted transmission portions and light blocking portions may be selected. With this arrangement, of illumination light transmitted through the first aperture stop 24, 0th-order diffracted light reflected by the substrate 3 is blocked by the light blocking portion of the second aperture stop 34 and does not reach the photoelectric converter 37. This makes it possible to obtain a high-contrast image from only substantial signal light diffracted by the alignment mark 19. As described above, the illumination optical system 110 and the detection optical system 130 can constitute a dark-field microscope.

Figure 7:
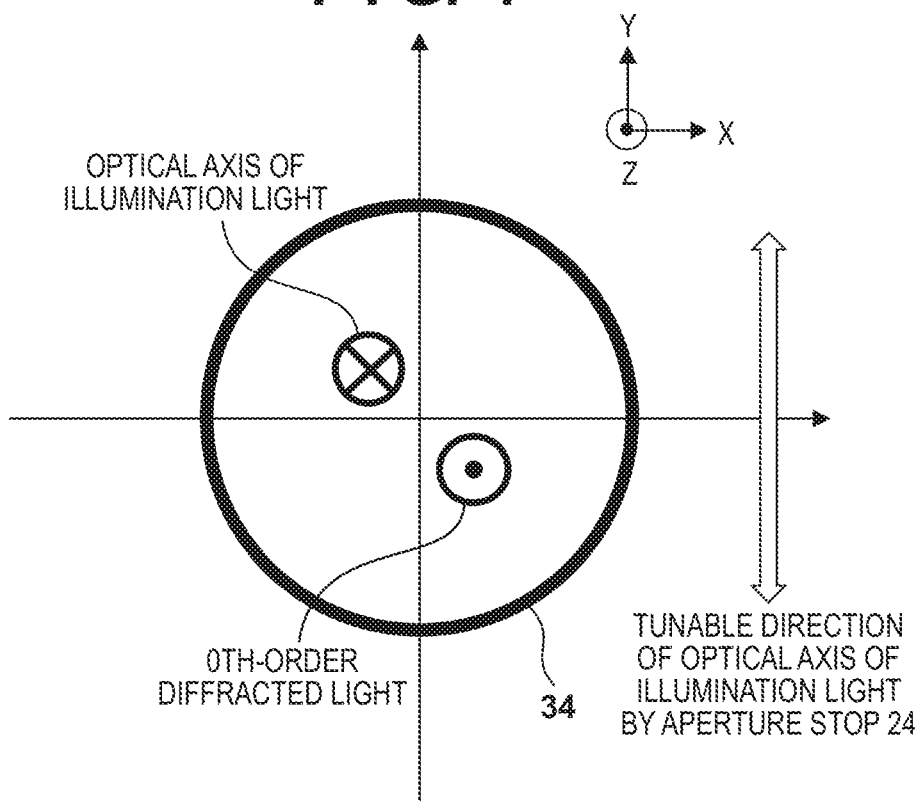
FIG. 7 is a view schematically showing the state of the position detection system before tuning of the first aperture stop of the illumination optical system.
Figure 8:
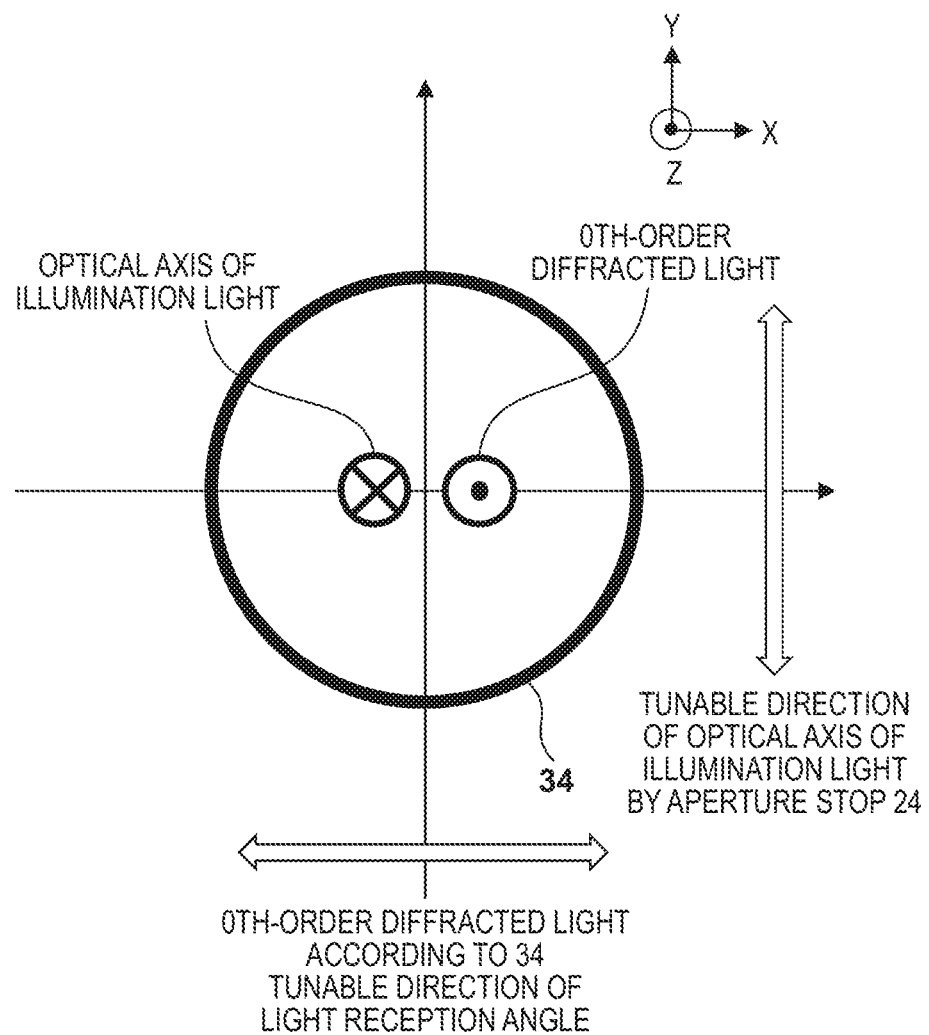
FIG. 8 is a view schematically showing the state of the position detection system before tuning of the second aperture stop of the detection optical system.

In order to form a proper image on the light-receiving surface of the photoelectric converter 37 it is necessary to fine-tune the relative position between the first aperture stop 24 and the second aperture stop 34 regardless of the type of combination of the first aperture stop 24 and the second aperture stop 34. FIG. 7 schematically shows the state of the position detection system 16 before tuning of the first aperture stop 24 of the illumination optical system 110. Referring to FIG. 7 and FIG. 8 to be referred to later, the circle drawn in the thick solid line represents the second aperture stop 34 of the detection optical system 130 before tuning. As exemplarily shown in FIG. 7, in the first aperture stop 24 of the illumination optical system 110 before tuning, the optical axis of illumination light illuminating the substrate 3 is shifted from the normal direction of the surface of the substrate 3. Accordingly, the direction of 0th-order diffracted light reflected from the substrate 3 is shifted from the center of the second aperture stop 34 of the detection optical system 130 before tuning. As described already, the first aperture stop 24 of the illumination optical system 110 is arranged on an optical Fourier transform plane (the pupil plane of the illumination optical system 110) with respect to a plane where the substrate 3 is located. Accordingly, tuning the first aperture stop 24 is equivalent to tuning the incident angle of illumination light entering an effective light source, that is, the substrate 3. In the state exemplarily shown in FIG. 7, when the first aperture stop 24 of the illumination optical system 110 is driven in the first direction (Z-axis direction), the optical axis of illumination light moves in the third direction (Y-axis direction) on the surface on which the second aperture stop 34 of the detection optical system 130 is arranged. This sets the position detection system 16 in the state exemplarily shown in FIG. 8.

Figures 9, 10:
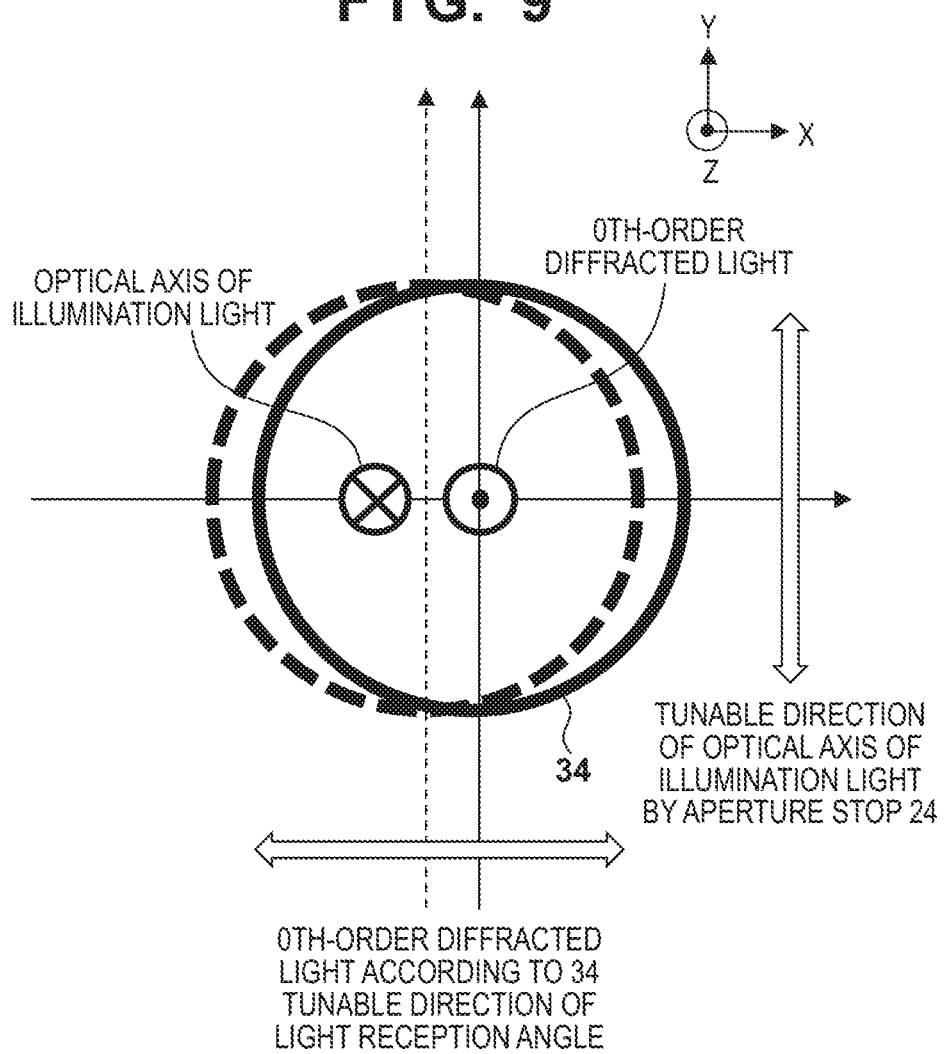
FIG. 9 is a view schematically showing the state of the position detection system after turning of both the first aperture stop of the illumination optical system and the second aperture stop of the detection optical system.
FIG. 10 is a view exemplarily showing the sensitivities of the first aperture stop of the illumination optical system and the second aperture stop of the detection optical system.

Referring to FIG. 8, the second aperture stop 34 of the detection optical system 130 remains shifted from the optical axis of illumination light in the X direction. In this case, because the second aperture stop 34 of the detection optical system 130 is located on an optical Fourier transform plane with respect to the light-receiving surface of the photoelectric converter 37, tuning the second aperture stop 34 of the detection optical system 130 is equivalent to selecting the order of diffracted light from the substrate 3 which is received by the photoelectric converter 37. In the state exemplarily shown in FIG. 8, when the second aperture stop 34 of the detection optical system 130 is driven in a tunable direction (X-axis direction) of the light reception angle of 0th-order diffracted light, the 0th-order diffracted light reflected from the substrate 3 can be tuned to the center of the pupil of the detection optical system 130, as exemplarily shown in FIG. 9. Referring to FIG. 9, the circle drawn in the thick solid line represents the second aperture stop 34 of the detection optical system 130 after tuning, and the second aperture stop 34 before tuning is drawn in the thick broken line.

In general, diffracted light from a symmetrical target like the alignment mark 19 is positive/negative symmetric with respect to 0th-order diffracted light as a center. Accordingly, tuning 0th-order diffracted light centered on the pupil of the detection optical system 130 makes it possible to form a proper image with little distortion on the light-receiving surface of the photoelectric converter 37. Note, however, that, tuning 0th-order diffracted light from the substrate 3 centering around the pupil of the detection optical system 130 produces merely an exemplary effect. Assume that the asymmetric aberration of the position detection system 16 is large. In this case, there is a chance of performing an operation of blocking a diffracted light beam passing through a portion of the pupil plane which has high aberration regardless of damaging the symmetry of captured diffracted light.

According to the first embodiment, the first driving mechanism 38 and the second driving mechanism 39, which are used to select the first aperture stop 24 and the second aperture stop 34, perform fine-tuning of the first aperture stop 24 and the second aperture stop 34 of the position detection system 16. Accordingly, the arrangement for fine-tuning the first aperture stop 24 and the second aperture stop 34 of the position detection system 16 can be simplified. In addition, according to the first embodiment, the degrees of freedom in tuning the pupil in two intersecting directions are allocated to the illumination optical system 110 and the detection optical system 130. Accordingly, it is unnecessary to add new shaft driving mechanisms to the first driving mechanism 38 and the second driving mechanism 39. Therefore, the first embodiment can tune the position of the pupil by using the minimum mechanical mechanism that is highly compatible with the aperture stop switching mechanism for improving contrast. In addition, incorporating the position detection system 16 described above in the exposure apparatus EXP can provide the exposure apparatus EXP advantageous in terms of cost and overlay accuracy.

The second embodiment will be described below. Particulars that are not mentioned in the second embodiment can comply with the first embodiment. The second embodiment will exemplify a suitable operation procedure at the time of operating an exposure apparatus EXP equipped with a position detection system 16. Operating the exposure apparatus EXP can include a step (to be referred to as a tuning/checking step hereinafter) of tuning the state of the exposure apparatus EXP at the time of shipment/installation of the exposure apparatus EXP and checking whether the tuned state is good. In this checking step, as a method of evaluating the tuned state of the position detection system 16, it is possible to observe an alignment mark 19 provided on a substrate 3 for tuning with the position detection system 16 while a substrate driving mechanism 18 is driving a substrate stage 4 in the Z-axis direction. Assume that the optical axis of illumination light illuminating the substrate 3 as exemplarily shown in FIG. 7 is shifted from the normal to the surface of the substrate 3. In this case, as the substrate stage 4 is driven in the Z-axis direction, the image of the alignment mark 19 which is captured by the photoelectric converter 37 can shift in the horizontal direction. This makes it possible to evaluate the degree of shift of the optical axis of illumination light illuminating the substrate 3 from the normal to the surface of the substrate 3 based on the direction and magnitude of a shift amount when the substrate stage 4 is driven by a fine unit amount $\delta Z$ in the Z-axis direction. In this case, let (Ex, Ey) be the orthogonal component of a vector representing the direction and magnitude of the shift amount.

In the tuning/checking step, values representing how much Ex and Ey change, that is, sensitivities, can be obtained in advance by driving a first aperture stop 24 of an illumination optical system 110 and a second aperture stop 34 of a detection optical system 130 by fine unit amounts $\delta x$ and $\delta y$, respectively. Assume that a sensitivity table obtained in this manner is the table shown in FIG. 10. Referring to FIG. 10, a numerical value a represents the amount of change in Ex when the first aperture stop 24 of the illumination optical system 110 is driven by $\delta x$, and a numerical value c represents the amount of change in Ey that occurs at the same time. Likewise, a numerical value b represents the amount of change in Ex when the second aperture stop 34 of the detection optical system 130 is driven by $\delta y$, and a numerical value d represents the amount of change in Ey that occurs at the same time.

Letting ExT be a driven target value of Ex, and EyT be a driven target value of Ey, amounts (x, y) by which a first driving mechanism 38 and a second driving mechanism 39 should drive, which are measured in the fine unit amounts $\delta x$ and $\delta y$, can be obtained from the following simultaneous equations:

$$ExT-Ex=ax+by$$

$$EyT-Ey=cx+dy$$

Obtaining a sensitivity table like that shown in FIG. 10 in a tuning/checking step once in advance in this manner makes it possible to quickly calculate the amounts (x, y) by which the first driving mechanism 38 and the second driving mechanism 39 should drive by using the above equations when it becomes necessary thereafter to tune the position detection system 16. Always keeping the image forming state of the position detection system 16 proper can contribute to manufacturing high-quality articles with a high yield ratio by using the exposure apparatus EXP equipped with the position detection system 16.

A method of manufacturing an article (a semiconductor IC element, liquid crystal display element, MEMS, or the like) by using the above exposure apparatus will be described next. An article is manufactured by a step of exposing a substrate (a substrate, glass substrate, or the like) coated with a photosensitizing agent to light by using the above exposure apparatus, a step of developing the substrate (photosensitizing agent), and processing the developed substrate in other known steps. Other known steps include etching, resist removal, dicing, bonding, and packaging. This article manufacturing method can manufacture an article with higher quality than the conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-070712, filed Apr. 2, 2019, which is hereby incorporated by reference herein in its entirety

What is claimed is:

1. A position detection apparatus comprising:
   a photoelectric converter;
   an illumination optical system configured to illuminate a target;
   a detection optical system configured to form an image of the target illuminated with light from the illumination optical system on a light-receiving surface of the photoelectric converter;
   a first array having a plurality of first aperture stops configured to be arranged on a pupil of the illumination optical system;
   a second array having a plurality of second aperture stops configured to be arranged on a pupil of the detection optical system;
   a first driving mechanism configured to arrange a first aperture stop, selected from the plurality of first aperture stops, which crosses an optical axis of the illumination optical system, on the pupil of the illumination optical system by driving the first array such that the first aperture stop moves in a first direction; and
   a second driving mechanism configured to arrange a second aperture stop, selected from the plurality of second aperture stops, which crosses an optical axis of the detection optical system, on the pupil of the detection optical system by driving the second array such that the second aperture stop moves in a second direction,
   wherein the first driving mechanism is further configured to tune a position of the selected first aperture stop in the first direction, and the second driving mechanism is further configured to tune the selected second aperture stop in the second direction,
   wherein when the first driving mechanism drives the first aperture stop in the first direction, a light beam from the target moves on the pupil of the detection optical system in a third direction intersecting with the second direction.

2. The apparatus according to claim 1, wherein the first direction is a direction parallel to a given plane, and the second direction is a direction intersecting with the plane.

3. The apparatus according to claim 1, wherein the first direction and the second direction are directions perpendicular to each other.

4. The apparatus according to claim 1, wherein the illumination optical system and the detection optical system constitute a dark-field microscope.

5. The apparatus according to claim 1, wherein the first driving mechanism drives the entire first array in the first direction, and the second driving mechanism rotates/drives the second array.

6. The apparatus according to claim 1, wherein the first driving mechanism rotates or drives the first array, and the second driving mechanism rotates or drives the second array.

7. The apparatus according to claim 1, wherein the first driving mechanism rotates or drives the first array, and the second driving mechanism drives the entire second array in the second direction.

8. The apparatus according to claim 1, wherein the first driving mechanism drives the entire first array in the first direction, and the second driving mechanism drives the entire second array in the second direction.

9. An exposure apparatus that exposes a substrate to light, the apparatus comprising a position detection apparatus defined in claim 1 and configured to detect a mark on the substrate.

10. An article manufacturing method comprising:
exposing a substrate to light by using an exposure apparatus, the exposure apparatus comprising:
a photoelectric converter;
an illumination optical system configured to illuminate a target;
a detection optical system configured to form an image of the target illuminated with light from the illumination optical system on a light-receiving surface of the photoelectric converter;
a first array having a plurality of first aperture stops configured to be arranged on a pupil of the illumination optical system;
a second array having a plurality of second aperture stops configured to be arranged on a pupil of the detection optical system;
a first driving mechanism configured to arrange a first aperture stop, selected from the plurality of first aperture stops, which crosses an optical axis of the illumination optical system, on the pupil of the illumination optical system by driving the first array such that the first aperture stop moves in a first direction; and
a second driving mechanism configured to arrange a second aperture stop, selected from the plurality of second aperture stops, which crosses an optical axis of the detection optical system, on the pupil of the detection optical system by driving the second array such that the second aperture stop-moves in a second direction,
wherein the first driving mechanism is further configured to tune a position of the selected first aperture stop in the first direction, and the second driving mechanism is further configured to tune the selected second aperture stop in the second direction;
wherein when the first driving mechanism drives the first aperture stop in the first direction, a light beam from the target moves on the pupil of the detection optical system in a third direction intersecting with the second direction; and
processing the substrate having undergone the exposing, wherein an article is manufactured from the substrate having undergone the processing.

11. The apparatus according to claim 1, wherein the second direction intersects the first direction.

12. The method according to claim 10, wherein the second direction intersects the first direction.

* * * * *